(12) United States Patent
Okutomi et al.

(10) Patent No.: US 10,297,982 B2
(45) Date of Patent: May 21, 2019

(54) ESD PROTECTIVE DEVICE AND METHOD FOR MANUFACTURING THEREOF

(71) Applicant: Murata Manufacturing Co., Ltd., Nagaokakyo-shi, Kyoto-fu (JP)

(72) Inventors: Yoshihito Okutomi, Nagaokakyo (JP); Jun Adachi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 300 days.

(21) Appl. No.: 15/424,944

(22) Filed: Feb. 6, 2017

(65) Prior Publication Data

US 2017/0149215 A1    May 25, 2017

Related U.S. Application Data

(63) Continuation of application No. PCT/JP2015/070943, filed on Jul. 23, 2015.

(30) Foreign Application Priority Data

Sep. 10, 2014   (JP) ................ 2014-184467

(51) Int. Cl.
| | |
|---|---|
| *H02H 9/00* | (2006.01) |
| *H01T 2/02* | (2006.01) |
| *H01T 1/20* | (2006.01) |
| *H01T 4/10* | (2006.01) |
| *H01T 21/00* | (2006.01) |
| *H01T 1/24* | (2006.01) |
| *H05K 1/02* | (2006.01) |

(52) U.S. Cl.
CPC ............. *H01T 2/02* (2013.01); *H01T 1/20* (2013.01); *H01T 1/24* (2013.01); *H01T 4/10* (2013.01); *H01T 21/00* (2013.01); *H05K 1/026* (2013.01)

(58) Field of Classification Search
USPC ................................... 361/56, 111
See application file for complete search history.

(56) References Cited

U.S. PATENT DOCUMENTS

| | | | | |
|---|---|---|---|---|
| 6,475,317 | B1 * | 11/2002 | Baba ............... | B32B 18/00 156/89.12 |
| 8,885,324 | B2 * | 11/2014 | Bultitude ........... | H01G 4/30 361/279 |

(Continued)

FOREIGN PATENT DOCUMENTS

| | | |
|---|---|---|
| JP | 09-266053 A | 10/1997 |
| JP | 2001-043954 A | 2/2001 |

(Continued)

OTHER PUBLICATIONS

Official Communication issued in corresponding International Application PCT/JP2015/070943, dated Oct. 13, 2015.

*Primary Examiner* — Ronald W Leja

(74) *Attorney, Agent, or Firm* — Keating & Bennett, LLP

(57) ABSTRACT

An ESD protective device includes an element assembly with a hollow portion that includes inner surfaces including a first inner surface, a second inner surface, and a third inner surface inclined to a Z direction in a cross section including the Z direction. Accordingly, a surface area of the inner surfaces of the hollow portion is increased, the heat load on an auxiliary discharge electrode is reduced, and the deterioration of the auxiliary discharge electrode is significantly reduced or prevented.

20 Claims, 9 Drawing Sheets

(56) References Cited

U.S. PATENT DOCUMENTS

| | | | |
|---|---|---|---|
| 9,142,353 B2* | 9/2015 | Bultitude | H01G 4/30 |
| 2005/0093445 A1* | 5/2005 | Min | H01J 11/12 |
| | | | 313/582 |
| 2008/0001853 A1* | 1/2008 | Cho | B24C 1/04 |
| | | | 345/67 |
| 2009/0067113 A1 | 3/2009 | Urakawa | |
| 2013/0077199 A1* | 3/2013 | Ikeda | H01T 1/22 |
| | | | 361/56 |
| 2014/0340812 A1* | 11/2014 | Sumi | H01T 1/20 |
| | | | 361/220 |
| 2017/0149215 A1* | 5/2017 | Okutomi | H01T 1/24 |
| 2017/0244223 A1* | 8/2017 | Yasunaka | H01T 1/20 |

FOREIGN PATENT DOCUMENTS

| | | |
|---|---|---|
| JP | 2001-057282 A | 2/2001 |
| JP | 2007-227259 A | 9/2007 |
| JP | 2010-129320 A | 6/2010 |
| WO | 2008/146514 A1 | 12/2008 |
| WO | 2013/115054 A1 | 8/2013 |

\* cited by examiner

ESD PROTECTIVE DEVICE AND METHOD FOR MANUFACTURING THEREOF

CROSS REFERENCE TO RELATED APPLICATIONS

This application claims the benefit of priority to Japanese Patent Application No. 2014-184467 filed on Sep. 10, 2014 and is a Continuation Application of PCT Application No. PCT/JP2015/070943 filed on Jul. 23, 2015. The entire contents of each application are hereby incorporated herein by reference.

BACKGROUND OF THE INVENTION

1. Field of the Invention

The present invention relates to an ESD protective device and a method for manufacturing thereof.

2. Description of the Related Art

One example of known ESD protective devices is described in International Publication No. WO 2008/146514. This ESD protective device includes an element assembly made of a ceramic material and first and second discharge electrodes and an auxiliary discharge electrode disposed inside the element assembly. The first discharge electrode and second discharge electrode are opposed to each other with a gap interposed therebetween. The auxiliary discharge electrode is disposed in the gap between the first discharge electrode and second discharge electrode.

In the above-described known ESD protective device, when static electricity is discharged between the first discharge electrode and second discharge electrode, heat involved in the discharge is generated. In particular, when static electricity is discharged through the auxiliary discharge electrode, the auxiliary discharge electrode undergoes a heat load resulting from the discharge. The heat load resulting from the discharge may cause deterioration of the auxiliary discharge electrode.

SUMMARY OF THE INVENTION

Accordingly, preferred embodiments of the present invention provide an ESD protective device capable of reducing a heat load on an auxiliary discharge electrode and significantly reducing or preventing deterioration of the auxiliary discharge electrode and a method for manufacturing thereof.

An ESD protective device in the present invention includes an element assembly in which a plurality of ceramic layers are laminated, a first discharge electrode and a second discharge electrode disposed inside the element assembly and opposed to each other with a gap disposed therebetween, and an auxiliary discharge electrode overlapping the gap as seen from a lamination direction in which the ceramic layers are laminated.

The element assembly includes a hollow portion, and the hollow portion is disposed on a side opposite to the auxiliary discharge electrode with respect to the first discharge electrode and the second discharge electrode and is continuous with the gap.

The hollow portion includes inner surfaces including a first inner surface and a second inner surface, and the first inner surface and the second inner surface are aligned in the lamination direction and inclined to the lamination direction in a cross section including the lamination direction.

Here, examples of the first inner surface and second inner surface may include flat surfaces, concave curved surfaces, and convex curved surfaces.

According to an ESD protective device according to a preferred embodiment of the present invention, because the inner surfaces of the hollow portion include the first inner surface and second inner surface inclined to the lamination direction of the ceramic layers in the cross section including the lamination direction of the ceramic layers, the surface area of the inner surfaces of the hollow portion is able to be increased. Accordingly, heat occurring in electrostatic discharge is able to be satisfactorily dissipated from the inner surfaces of the hollow portion. This results in reduction of heat load on the auxiliary discharge electrode and in significant reduction or prevention of deterioration of the auxiliary discharge electrode.

In an ESD protective device according to a preferred embodiment of the present invention, the first inner surface and the second inner surface may be inclined to the same direction so as to face the same direction with respect to the lamination direction.

In an ESD protective device according to a preferred embodiment of the present invention, the first inner surface and the second inner surface may be inclined to opposite directions so as to face the opposite directions with respect to the lamination direction.

In an ESD protective device according to a preferred embodiment, an inside diameter of the first inner surface and an inside diameter of the second inner surface may be of equal size.

In an ESD protective device according to a preferred embodiment, an inside diameter of the first inner surface and an inside diameter of the second inner surface may be of different sizes.

A method for manufacturing an ESD protective device according to a preferred embodiment of the present invention includes a step of preparing a first ceramic sheet by forming a first hole portion on the first ceramic sheet, the first hole portion including a first inner surface inclined to a direction perpendicular or substantially perpendicular to a plane direction of the first ceramic sheet, a step of preparing a second ceramic sheet by forming a second hole portion on the second ceramic sheet, the second hole portion including a second inner surface inclined to a direction perpendicular or substantially perpendicular to a plane direction of the second ceramic sheet, a step of disposing an auxiliary discharge electrode on a base ceramic sheet and disposing a first discharge electrode and a second discharge electrode on the auxiliary discharge electrode such that the first discharge electrode and the second discharge electrode are opposed to each other with a gap disposed therebetween, a step of laminating the first ceramic sheet, the second ceramic sheet, and a cover ceramic sheet in sequence above the first discharge electrode and the second discharge electrode such that the first hole portion and the second hole portion overlap the gap and forming a multilayer body, and a step of firing the multilayer body and forming a hollow portion continuous with the gap from the first hole portion and the second hole portion.

Here, examples of the first inner surface and second inner surface may include flat surfaces, concave curved surfaces, and convex curved surfaces.

According to a method for manufacturing an ESD protective device according to a preferred embodiment of the present invention, because the hollow portion continuous with the gap is formed from the first hole portion and the second hole portion, the first inner surface of the first hole portion and the second inner surface of the second hole portion are inclined to the direction in which the ceramic sheets are laminated. Accordingly, the surface area of the inner surfaces of the hollow portion is able to be increased, and heat occurring in electrostatic discharge is able to be satisfactorily dissipated from the inner surfaces of the hollow portion. This results in reduction of heat load on the auxiliary discharge electrode and in significant reduction or prevention of deterioration of the auxiliary discharge electrode.

In a method for manufacturing an ESD protective device according to a preferred embodiment, the first hole portion and the second hole portion may be formed by laser light.

According to a method for manufacturing an ESD protective device according to a preferred embodiment of the present invention, because the first hole portion and the second hole portion are formed by laser light, the first hole portion and the second hole portion are able to be easily formed.

In a method for manufacturing an ESD protective device according to a preferred embodiment of the present invention, in the step of preparing the first ceramic sheet, the first hole portion may be filled with paste having a property of being burned out so as to be eliminated during firing, and in the step of preparing the second ceramic sheet, the second hole portion may be filled with paste having a property of being burned out so as to be eliminated during firing.

According to a method for manufacturing an ESD protective device according to a preferred embodiment of the present invention, the first hole portion and the second hole portion are filled with the paste having the property of being burned out so as to be eliminated during firing. Thus, in the step of forming the multilayer body, filling the first and second hole portions with the cover ceramic sheet is able to be reduced or prevented. Reductions in stiffness of the first and second ceramic sheets are able to be reduced or prevented, and the deformation of the multilayer body is able to be reduced or prevented in the step of forming the multilayer body.

According to an ESD protective device and a method for manufacturing thereof according to preferred embodiments of the present invention, the heat load on the auxiliary discharge electrode is able to be reduced, and the deterioration of the auxiliary discharge electrode is able to be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention is described in detail below with reference to illustrated preferred embodiments.

First Preferred Embodiment

Figure 1:
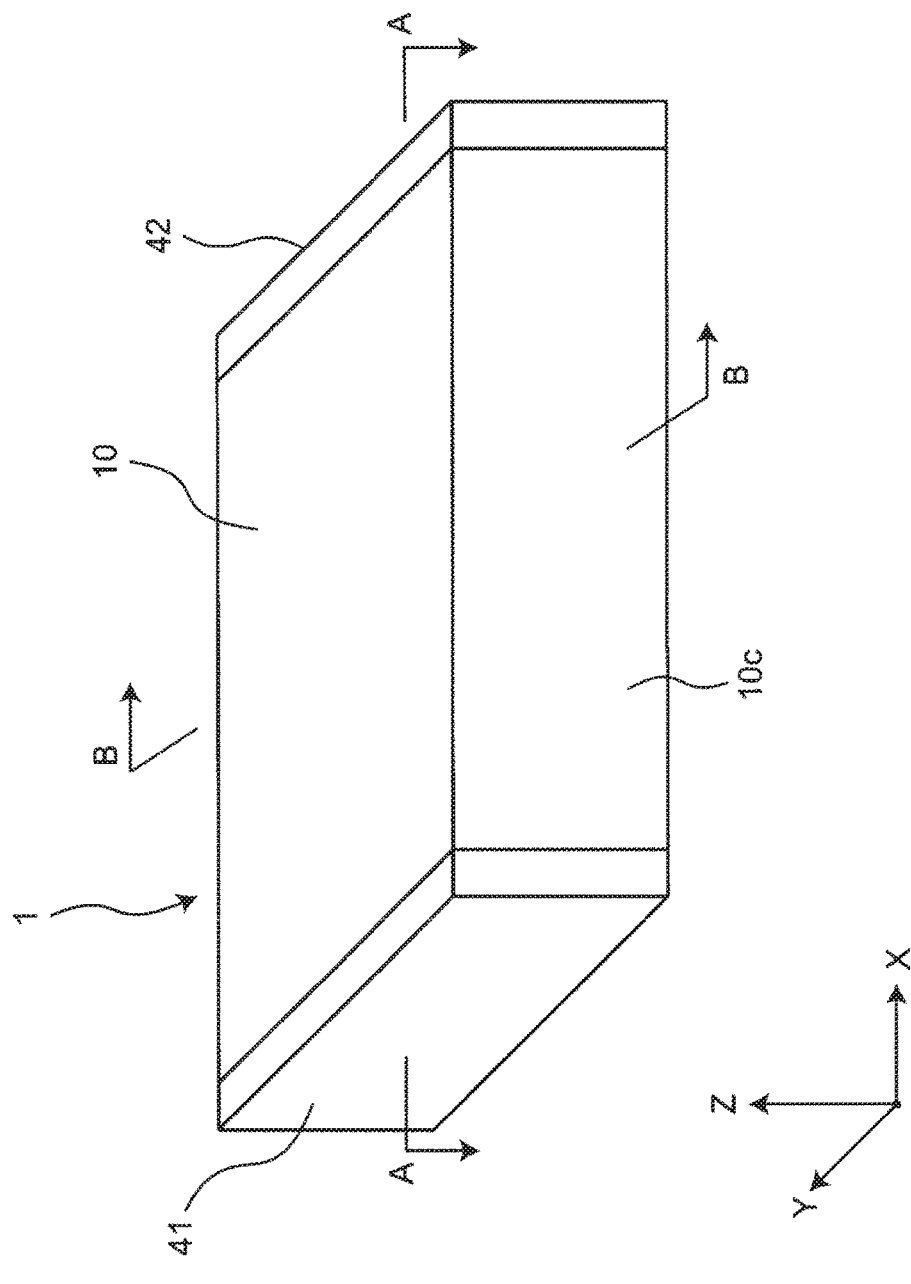
FIG. 1 is a perspective view that illustrates an ESD protective device according to a first preferred embodiment of the present invention.
Figure 2:
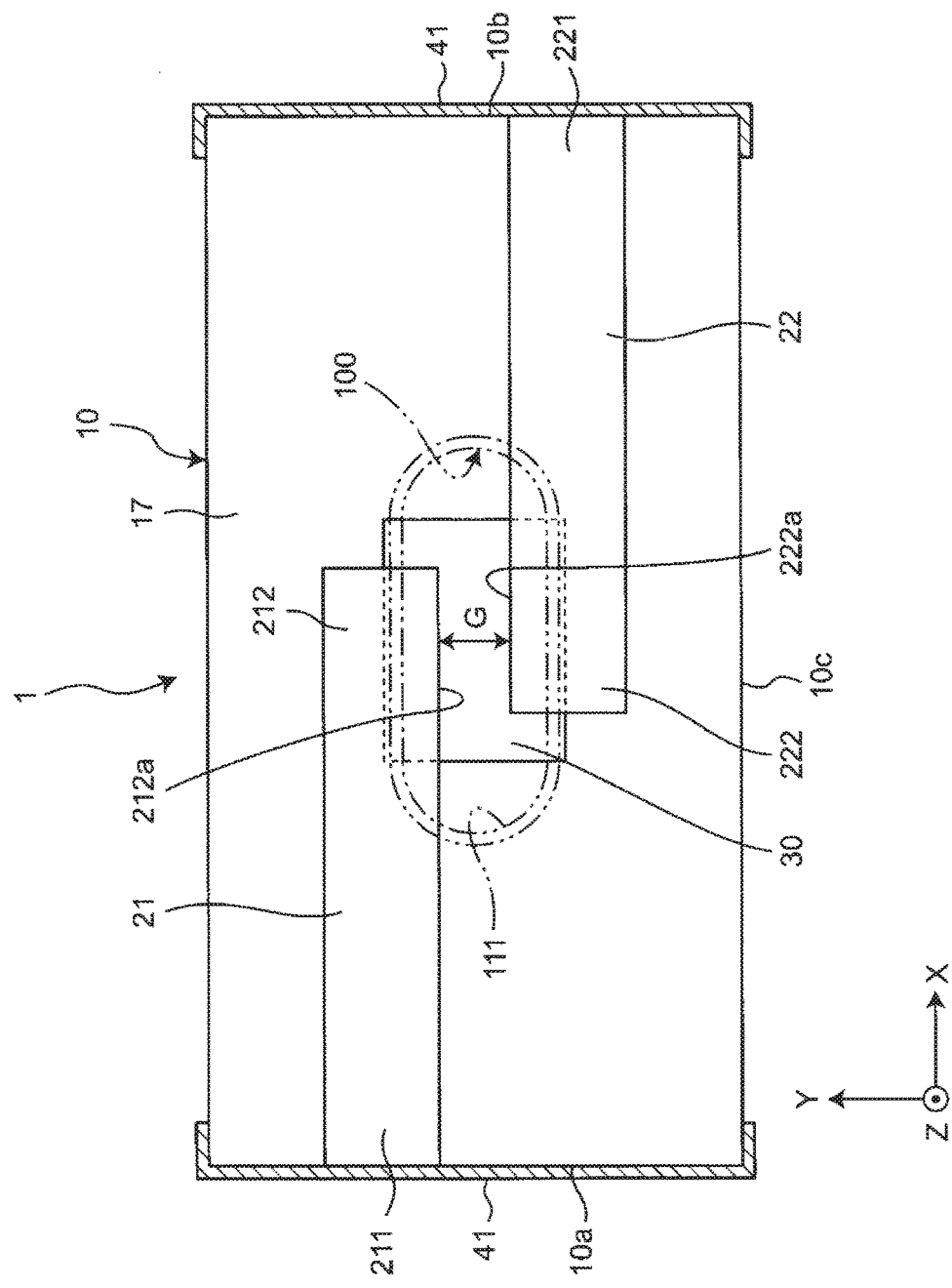
FIG. 2 is a cross-sectional view taken along A-A in FIG. 1.
Figure 3:
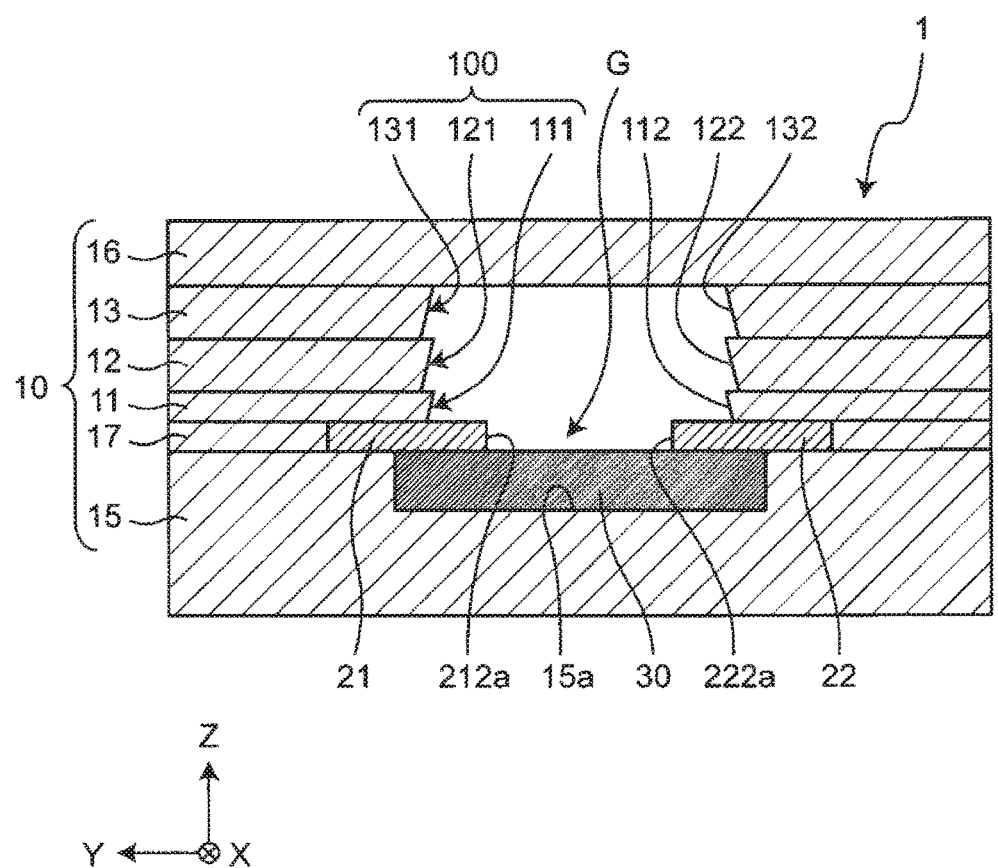
FIG. 3 is a cross-sectional view taken along B-B in FIG. 1.

FIG. 1 is a perspective view that illustrates an ESD protective device according to a first preferred embodiment of the present invention. FIG. 2 is a cross-sectional view taken along A-A in FIG. 1. FIG. 3 is a cross-sectional view taken along B-B in FIG. 1. As illustrated in FIGS. 1-3, an electro-static discharge (ESD) protective device 1 includes an element assembly 10, a first discharge electrode 21, second discharge electrode 22, and auxiliary discharge electrode 30 disposed inside the element assembly 10. One example of the ESD protective device 1 may be used in an electronic apparatus, discharge static electricity occurring in the electronic apparatus and reduce breakage of the electronic apparatus caused by the static electricity.

The element assembly 10 has a structure in which a plurality of ceramic layers 11 to 13 and 15 to 17 are laminated. Specifically, the base ceramic layer 15, electrode ceramic layer 17, first ceramic layer 11, second ceramic layer 12, third ceramic layer 13, and cover ceramic layer 16 are laminated in sequence from below.

Each of the ceramic layers 11 to 13 and 15 to 17 may be made of, for example, low temperature co-fired ceramics (LTCC) predominantly composed of barium, aluminum, and silicon. The ceramic layers 11 to 13 and 15 to 17 may include at least one of an alkali metal component and a boron component. The ceramic layers 11 to 13 and 15 to 17 may contain a glass component.

The element assembly 10 has a rectangular or an approximately rectangular parallelepiped shape. The outer surfaces of the element assembly 10 include a first end surface 10a, a second end surface 10b on the opposite side to the first end surface 10a, and a peripheral surface 10c between the first end surface 10a and second end surface 10b.

Here, the direction connecting the first end surface 10a and second end surface 10b is defined as an X direction, the direction of the lamination of the plurality of ceramic layers 11 to 13 and 15 to 17 is defined as a Z direction, and the direction perpendicular or substantially perpendicular to the X direction and Z direction is defined as a Y direction. The side on which the cover ceramic layer 16 is positioned in the Z direction is defined as an upper side, and the side on which the base ceramic layer 15 is positioned in the Z direction is defined as a lower side. The X direction corresponds to the size direction of the ESD protective device 1, the Y direction corresponds to the width direction of the ESD protective device 1, and the Z direction corresponds to the height direction of the ESD protective device 1.

The first discharge electrode 21 and second discharge electrode 22 are disposed on the base ceramic layer 15. Each of the first discharge electrode 21 and second discharge electrode 22 has a strip shape extending along the X direction. The first discharge electrode 21 and second discharge electrode 22 are parallel or substantially parallel with each other in the Y direction. The first discharge electrode 21 and second discharge electrode 22 are opposed to each other with a gap G disposed therebetween.

The first discharge electrode 21 includes a first end portion 211 in the lengthwise direction, and the first end portion 211 is exposed from the first end surface 10a of the element assembly 10. The first discharge electrode 21 includes a second end portion 212 in the lengthwise direction, and the second end portion 212 is disposed inside the element assembly 10. The second discharge electrode 22 includes a first end portion 221 in the lengthwise direction, and the first end portion 221 is exposed from the second end surface 10b of the element assembly 10. The second discharge electrode 22 includes a second end portion 222 in the lengthwise direction, and the second end portion 222 is disposed inside the element assembly 10. The second end portion 212 in the first discharge electrode 21 includes a side surface 212a in the Y direction, the second end portion 222 in the second discharge electrode 22 includes a side surface 222a in the Y direction, and the side surface 212a and side surface 222a are opposed to each other with the gap G disposed therebetween.

Each of the first discharge electrode 21 and second discharge electrode 22 may be made of any appropriate material, such as copper, silver, palladium, platinum, aluminum, nickel, tungsten, or an alloy containing at least one of them.

The auxiliary discharge electrode 30 is disposed in a depression 15a in the base ceramic layer 15 such that it overlaps the lower side of the gap G as seen from the Z direction. The auxiliary discharge electrode 30 has a rectangular or substantially rectangular shape as seen from the Z direction. The auxiliary discharge electrode 30 connects the second end portion 212 in the first discharge electrode 21 and the second end portion 222 in the second discharge electrode 22.

The auxiliary discharge electrode 30 may be made of, for example, a mixture of a conductive material and an insulating material. Examples of the conductive material may include copper, silver, palladium, platinum, aluminum, nickel, tungsten, and any combination thereof. As the conductive material, a material having a conductivity lower than that of a metal material may be used, and examples of the material may include a semiconductor material, such as silicon carbide powder, and a resistance material. Examples of the semiconductor material may include a metal semiconductor, such as silicon or germanium, a carbide, such as silicon carbide, titanium carbide, zirconium carbide, or tungsten carbide, a nitride, such as titanium nitride, zirconium nitride, chromium nitride, vanadium nitride, or tantalum nitride, a silicide, such as titanium silicide, zirconium silicide, tungsten silicide, molybdenum silicide, or chromium silicide, a boride, such as titanium boride, zirconium boride, chromium boride, lanthanum boride, molybdenum boride, or tungsten boride, and an oxide, such as strontium titanate. Two or more of the above-described materials may be mixed as appropriate. The conductive material may be coated with an inorganic material. The inorganic material is not particularly limited. Examples of the inorganic material may include aluminum oxide ($Al_2O_3$), zirconium dioxide ($ZrO_2$), and silicon dioxide ($SiO_2$). It may be a mixed calcination powder of constituents of a ceramic base material. Examples of the insulating material may include an oxide, such as aluminum oxide ($Al_2O_3$), silicon dioxide ($SiO_2$), zirconium dioxide ($ZrO_2$), and titanium dioxide ($TiO_2$), a nitride, such as silicon nitride ($Si_3N_4$) or aluminum nitride (AlN), a mixed calcination powder of constituents of a ceramic base material, a vitreous material, and any combination thereof.

The auxiliary discharge electrode 30 reduces a discharge starting voltage between the first discharge electrode 21 and second discharge electrode 22. Discharges of static electricity include discharges through the auxiliary discharge electrode 30, in addition to a gaseous discharge. The discharges through the auxiliary discharge electrode 30 include a discharge over the surface of the auxiliary discharge electrode 30 (creeping discharge) and a discharge through the inside of the auxiliary discharge electrode 30.

Typically, among the gaseous discharge, the creeping discharge, and the discharge through the inside of the auxiliary discharge electrode 30, the discharge through the inside of the auxiliary discharge electrode 30 has the lowest discharge starting voltage. Accordingly, by providing the auxiliary discharge electrode 30, the discharge starting voltage between the first discharge electrode 21 and second discharge electrode 22 is able to be reduced. Consequently, dielectric breakdown of the ESD protective device 1 is significantly reduced or prevented. By providing the auxiliary discharge electrode 30, the responsivity of the ESD protective device 1 is able to be improved.

A first outer electrode 41 is disposed on the first end surface 10a of the element assembly 10. The first outer electrode 41 covers all of the first end surface 10a and the end portion in the peripheral surface 10c adjacent to the first end surface 10a. The first outer electrode 41 is in contact with the first end portion 211 in the first discharge electrode 21 and is electrically connected thereto.

A second outer electrode 42 is disposed on the second end surface 10b of the element assembly 10. The second outer electrode 42 covers all of the second end surface 10b and the end portion in the peripheral surface 10c adjacent to the second end surface 10b. The second outer electrode 42 is in contact with the first end portion 221 in the second discharge electrode 22 and is electrically connected thereto.

Each of the first outer electrode 41 and second outer electrode 42 may be made of, for example, any appropriate material, such as copper, silver, palladium, platinum, aluminum, nickel, tungsten, or an alloy that contains at least one of them.

The element assembly 10 includes a hollow portion 100 positioned on the side opposite to the auxiliary discharge electrode 30 with respect to the first and second discharge electrodes 21 and 22. The hollow portion 100 is continuous with the upper side of the gap G. The hollow portion 100 preferably includes a first hole portion 111 in the first ceramic layer 11, a second hole portion 121 in the second ceramic layer 12, and a third hole portion 131 in the third ceramic layer 13. The first hole portion 111, second hole portion 121, and third hole portion 131 are arranged concentrically in the Z direction and are joined together.

The first ceramic layer 11 is laminated on the first and second discharge electrodes 21 and 22 and electrode ceramic layer 17. The electrode ceramic layer 17 is arranged around the first and second discharge electrodes 21 and 22 on the base ceramic layer 15. The auxiliary discharge electrode 30 is exposed from the electrode ceramic layer 17. The top surface of the electrode ceramic layer 17 and the top surface of each of the first and second discharge electrodes 21 and 22 are flush or substantially flush with each other.

The first hole portion 111 in the first ceramic layer 11 has an oblong shape with a longer diameter in the X direction and a shorter diameter in the Y direction. The overall length portion in the auxiliary discharge electrode 30 along the X direction is exposed in the first hole portion 111, and the side surface 212a of the second end portion 212 in the first discharge electrode 21 and the side surface 222a of the second end portion 222 in the second discharge electrode 22 are exposed in the first hole portion 111. In FIG. 2, the first hole portion 111 is illustrated, the second and third hole portions 121 and 131 are omitted, and the second hole portion 121 and third hole portion 131 coincide with the first hole portion 111. The shape of the hollow portion 100 is the same as the shape of the first hole portion 111 as seen from the Z direction and is oblong.

The first hole portion 111 includes a first inner surface 112. The first inner surface 112 is inclined with respect to the Z direction in a cross section including the Z direction (YZ cross section in FIG. 3). Specifically, the first inner surface 112 tapers such that the inside diameter of the first inner surface 112 becomes gradually smaller toward the Z direction (upper side). The first inner surface 112 is a flat surface and is a linear taper.

In FIG. 2, the first hole portion 111 is indicated by double imaginary lines. The inner imaginary line indicates the minimum diameter of the first inner surface 112, and the outer imaginary line indicates the maximum diameter of the first inner surface 112. The minimum diameter of the first inner surface 112 in the X direction is larger than the length of the auxiliary discharge electrode 30 in the X direction. The minimum diameter of the first inner surface 112 in the Y direction is larger than the length of the gap G in the Y direction.

The second hole portion 121 in the second ceramic layer 12 and the third hole portion 131 in the third ceramic layer 13 have the same configuration as that of the first hole portion 111 in the first ceramic layer 11. That is, a second inner surface 122 of the second hole portion 121 and a third inner surface 132 of the third hole portion 131 have the same configuration as that of the first inner surface 112 of the first hole portion 111.

Specifically, the first inner surface 112, second inner surface 122, and third inner surface 132 are inclined to the same direction so as to face the same direction with respect to the Z direction. That is, the inside diameters of the first inner surface 112, the second inner surface 122, and the third inner surface 132 become smaller toward the Z direction.

The inside diameters of the first inner surface 112, second inner surface 122, and third inner surface 132 are of equal size or substantially equal size. That is, the minimum diameters of the first inner surface 112, second inner surface 122, and third inner surface 132 are of equal size or substantially equal size. The maximum diameters of the first inner surface 112, second inner surface 122, and third inner surface 132 are of equal size or substantially equal size.

The cover ceramic layer 16 does not have a hole portion and closes the third hole portion 131 in the third ceramic layer 13 from above. In this way, the inner surfaces of the hollow portion 100 include the first inner surface 112, second inner surface 122, and third inner surface 132. The hollow portion 100 is covered with the cover ceramic layer 16.

The side surface 212a of the second end portion 212 in the first discharge electrode 21 and the side surface 222a of the second end portion 222 in the second discharge electrode 22 are exposed in the hollow portion 100. The surface of the auxiliary discharge electrode 30 is exposed in the gap G. The hollow portion 100 and the gap G are joined together. This allows static electricity to be also discharged to the air inside the gap G and hollow portion 100.

The length of the hollow portion 100 (first hole portion 111) in the X direction is longer than the length of the auxiliary discharge electrode 30 in the X direction. That is, the overall length portion in the auxiliary discharge electrode 30 in the X direction is exposed from the hollow portion 100. Accordingly, an overlap portion between the overall length portion in the auxiliary discharge electrode 30 in the X direction and the element assembly 10 is able to be reduced, and short circuits that would arise from the overlap portion are able to be significantly reduced or prevented. The length of the hollow portion 100 in the X direction may be the same as the length of the auxiliary discharge electrode 30 in the X direction.

A non-limiting example of a method for manufacturing the ESD protective device 1 is described below.

Figure 4:
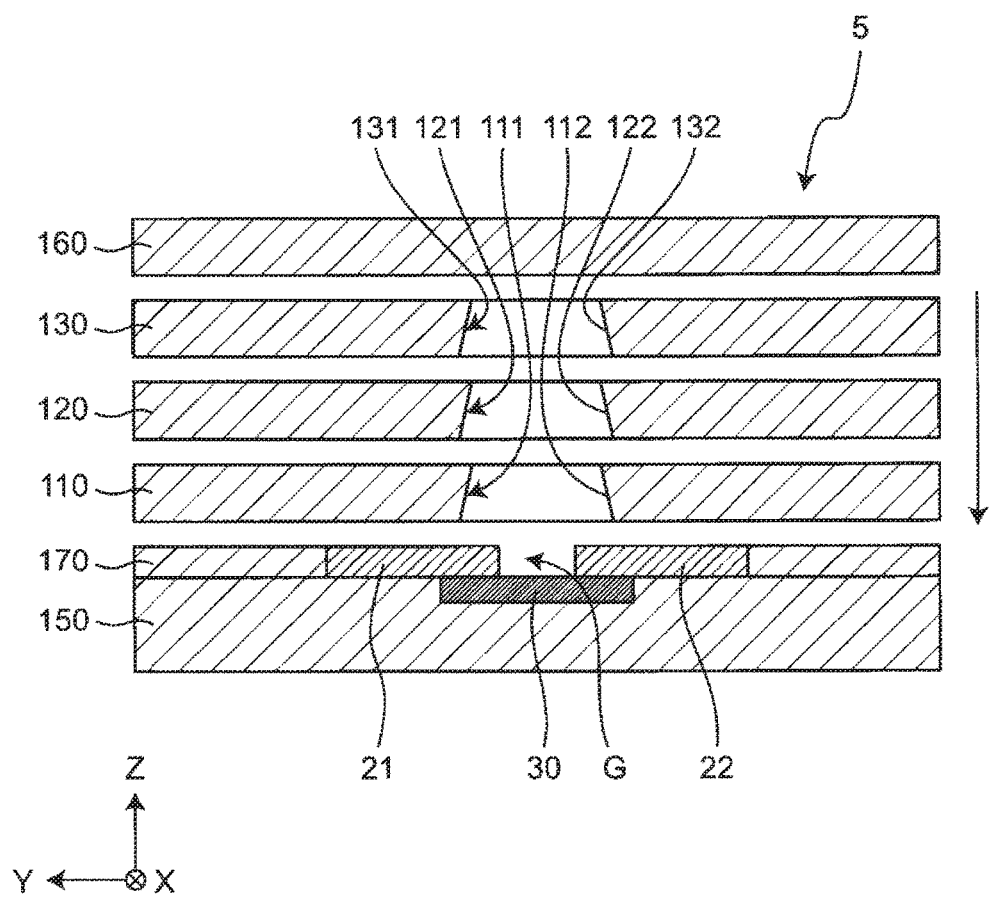
FIG. 4 is a cross-sectional view that illustrates a method for manufacturing an ESD protective device.

As illustrated in FIG. 4, the first hole portion 111 is formed in a first ceramic sheet 110, and the first ceramic sheet 110 is prepared. At this time, the first inner surface 112 of the first hole portion 111 is inclined with respect to a direction perpendicular or substantially perpendicular to the plane direction of the first ceramic sheet 110 (XY plane direction).

Figure 5:
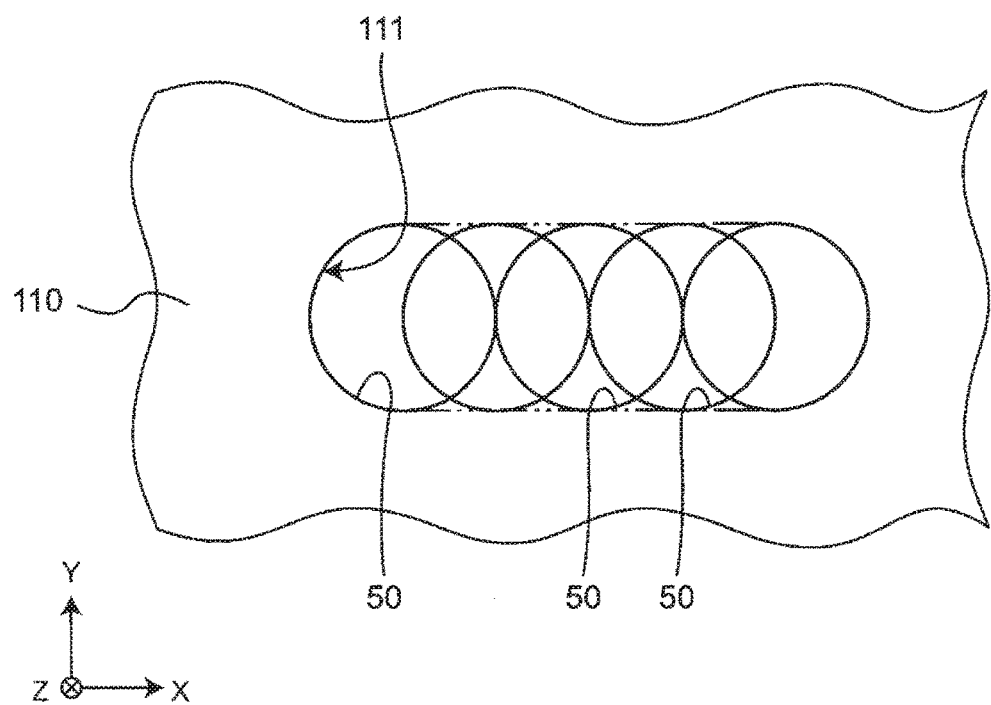
FIG. 5 is a plan view that illustrates a method for forming a first hole portion in a first ceramic sheet.

Here, as illustrated in FIG. 5, the first hole portion 111 is formed by laser light. Specifically, laser light is emitted along the X direction to the lower surface of the first ceramic sheet 110 in the Z direction. Then, a plurality of laser holes 50 formed by the laser light are aligned along the X direction, and they define the first hole portion 111.

Energy of the laser light attenuates from a surface of the first ceramic sheet 110 which the laser light enters (lower surface) to a surface of the first ceramic sheet 110 from which the laser light exits (upper surface). Therefore, the inside diameter of the first hole portion 111 on the upper surface side is smaller than the inside diameter of the first hole portion 111 on the lower surface side. Thus, the first inner surface 112 of the first hole portion 111 is able to be formed in a tapered shape. Accordingly, the first hole portion 111 is able to be easily formed. The diameter of the hole and the angle of the taper is able to be easily changed by changing the settings of the intensity and directional angle of the laser light.

Similarly, as illustrated in FIG. 4, the second hole portion 121 is formed in a second ceramic sheet 120, and the second ceramic sheet 120 is prepared. At this time, the second inner surface 122 of the second hole portion 121 is inclined with respect to a direction perpendicular or substantially perpendicular to the plane direction of the second ceramic sheet 120 (XY plane direction). The second hole portion 121 is formed by laser light.

Similarly, the third hole portion 131 is formed in a third ceramic sheet 130, and the third ceramic sheet 130 is prepared. At this time, the third inner surface 132 of the third hole portion 131 is inclined with respect to a direction perpendicular or substantially perpendicular to the plane direction of the third ceramic sheet 130 (XY plane direction). The third hole portion 131 is formed by laser light.

Then, the auxiliary discharge electrode 30 is formed on a base ceramic sheet 150, and the first discharge electrode 21 and second discharge electrode 22 are formed on the auxiliary discharge electrode 30 such that the first discharge electrode 21 and second discharge electrode 22 are opposed to each other with the gap G disposed therebetween.

Then, an electrode ceramic sheet 170 is formed on the base ceramic sheet 150. The first ceramic sheet 110, second ceramic sheet 120, third ceramic sheet 130, and a cover ceramic sheet 160 are laminated in sequence in the direction indicated by the arrow above the first discharge electrode 21 and second discharge electrode 22 such that the first hole portion 111, second hole portion 121, and third hole portion 131 overlap the gap G. In this way, a multilayer body 5 is formed.

After that, the multilayer body 5 is fired, and as illustrated in FIG. 3, the hollow portion 100 continuous with the gap G is formed from the first to third hole portions 111, 121, and 131. Then, as illustrated in FIG. 1, the first and second outer electrodes 41 and 42 are formed on the element assembly 10, and the ESD protective device 1 is manufactured.

When the hollow portion 100 is filled with an inert gas, such as argon, in the step of forming the multilayer body 5, the inert gas can be used in firing the multilayer body 5. This eliminates the necessity to form holes in the multilayer body 5 and fill it with an inert gas after the multilayer body 5 is formed. By filling the hollow portion 100 with the inert gas, the gaseous discharge inside the hollow portion 100 is able to be facilitated.

In the ESD protective device 1 having the above-described configuration, because the inner surfaces of the hollow portion 100 include the first inner surface 112, second inner surface 122, and third inner surface 132, which are inclined with respect to the Z direction in a cross section including the Z direction, the surface area of the inner surfaces of the hollow portion 100 is able to be increased, and the space inside the hollow portion 100 is able to be increased. If the inner surfaces of the hollow portion are parallel or substantially parallel to the Z direction, the surface area of the inner surfaces of the hollow portion (space inside the hollow portion) is the smallest. Even if the inner surfaces of the hollow portion include a single inclined surface, the surface area of the inner surfaces of the hollow portion (space inside the hollow portion) remains small.

In short, the inventor notes that the height direction (Z direction) of the ESD protective device 1 is less limited by mounting on a substrate than the length direction (X direction) and width direction (Y direction) of the ESD protective device 1 and comes up with the idea of extending the hollow portion 100 in the height direction. In addition to that, the inventor comes up with the idea of providing the inner surfaces of the hollow portion 100 with the plurality of inclined surfaces 112, 122, and 132 in the height direction because this idea leads to extension of the hollow portion 100 in the height direction.

Because the surface area of the inner surfaces of the hollow portion 100 is increased, heat occurring in electrostatic discharge is satisfactorily dissipated from the inner surfaces of the hollow portion 100. Accordingly, a heat load on the auxiliary discharge electrode 30 is able to be reduced, and deterioration of the auxiliary discharge electrode 30 is able to be significantly reduced or prevented. For example, the possibility that the auxiliary discharge electrode 30 is fused by the heat is able to be significantly reduced or prevented. This results in significant reduction or prevention of the possibility that the first discharge electrode 21 and second discharge electrode 22 are short-circuited by the auxiliary discharge electrode 30.

Because the space inside the hollow portion 100 is increased, electrostatic discharge occurring in the air inside the hollow portion 100 is facilitated, and discharges through the auxiliary discharge electrode 30 are significantly reduced. Because the space inside the hollow portion 100 is increased, energy occurring in electrostatic discharge, such as heat, light, or impact, is able to be absorbed by the space in the hollow portion 100.

Accordingly, because the load on the auxiliary discharge electrode 30 during electrostatic discharge is able to be reduced, deterioration of the auxiliary discharge electrode 30 is able to be significantly reduced or prevented, and even when the discharge repeats, the ESD protective device 1 with high responsivity is achieved.

Because the first inner surface 112, second inner surface 122, and third inner surface 132 are inclined to the same direction so as to face the same direction with respect to the Z direction, the first to third ceramic layers 11 to 13 can be laminated in the same orientation.

Because the inside diameters of the first inner surface 112, second inner surface 122, and third inner surface 132 are of equal size, the first to third ceramic layers 11 to 13 of the same kind can be used.

According to the method for manufacturing the ESD protective device 1, because the hollow portion 100 continuous with the gap G includes the first to third hole portions 111, 121, and 131, the first inner surface 112 of the first hole portion 111, the second inner surface 122 of the second hole portion 121, and the third inner surface 132 of the third hole portion 131 are inclined with respect to the direction in which the ceramic sheets 110, 120, and 130 are laminated (Z direction). Accordingly, the surface area of the inner surfaces of the hollow portion 100 is able to be increased, and heat occurring in electrostatic discharge is satisfactorily dissipated from the inner surfaces of the hollow portion 100. This results in reduction of heat load on the auxiliary discharge electrode 30 and in reduction or prevention of deterioration of the auxiliary discharge electrode 30.

Second Preferred Embodiment

Figure 6:
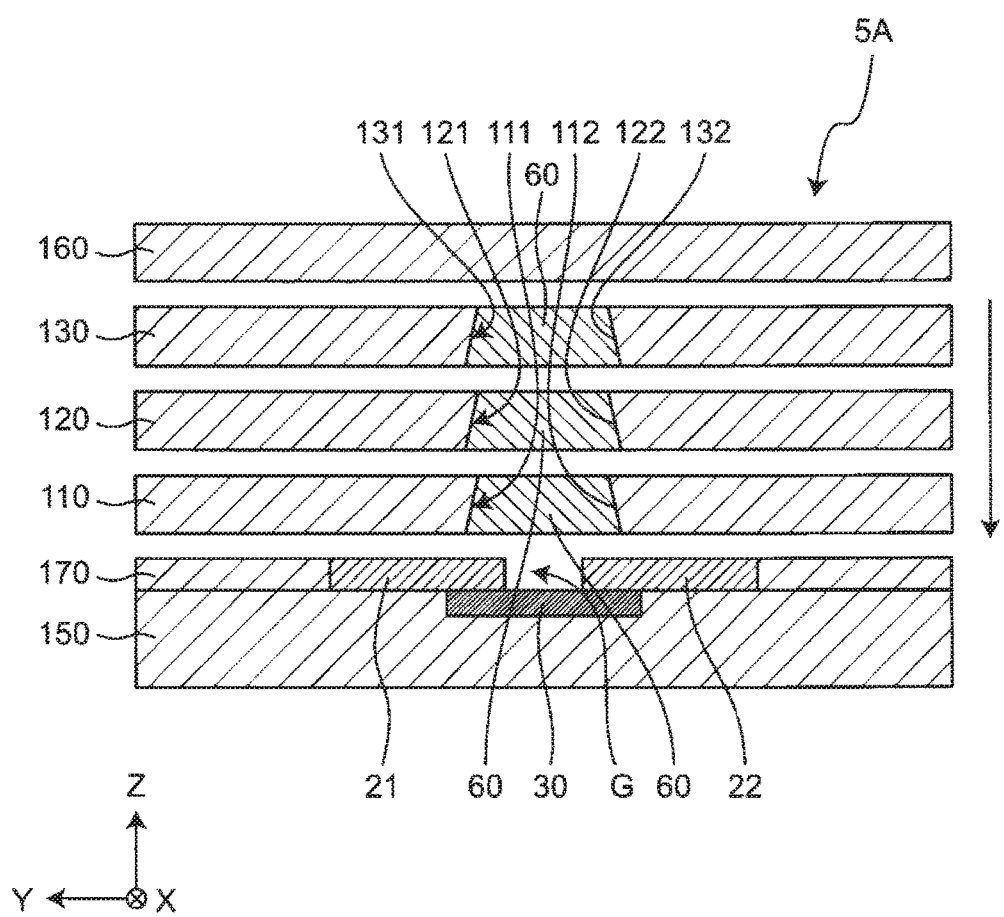
FIG. 6 is a cross-sectional view that illustrates a method for manufacturing an ESD protective device according to a second preferred embodiment of the present invention.

FIG. 6 is a cross-sectional view that illustrates a method for manufacturing an ESD protective device according to a second preferred embodiment of the present invention. The second preferred embodiment differs from the first preferred embodiment only in the steps of preparing the first to third ceramic sheets. Only the different steps are described below. In the second preferred embodiment, the same reference numerals as in the first preferred embodiment indicate the same configurations as in the first preferred embodiment, and the description thereof is omitted.

As illustrated in FIG. 6, in the step of preparing the first ceramic sheet 110, the first hole portion 111 is filled with paste 60 having the property of being burned out so as to be eliminated during firing. In the step of preparing the second ceramic sheet 120, the second hole portion 121 is filled with the paste 60 having the property of being burned out so as to be eliminated during firing. In the step of preparing the third ceramic sheet 130, the third hole portion 131 is filled with the paste 60 having the property of being burned out so as to be eliminated during firing.

After that, like in the first preferred embodiment, the electrode ceramic sheet 170, first ceramic sheet 110, second ceramic sheet 120, third ceramic sheet 130, and cover ceramic sheet 160 are laminated in sequence in the direction indicated by the arrow above the base ceramic sheet 150, and a multilayer body 5A is formed. Then, the multilayer body 5A is fired, and the ESD protective device 1 is manufactured. At this time, the paste 60 is burned out by firing.

According to the second preferred embodiment, because the first hole portion 111, second hole portion 121, and third hole portion 131 are filled with the paste 60, the occupation of the first hole portion 111, second hole portion 121, and third hole portion 131 by the cover ceramic sheet 160 is able to be reduced or prevented in the step of forming the multilayer body 5A. In addition, reductions in stiffness of the first ceramic sheet 110, second ceramic sheet 120, and third ceramic sheet 130 are able to be reduced or prevented, and the deformation of the multilayer body 5A is able to be reduced or prevented in the step of forming the multilayer body 5A.

Third Preferred Embodiment

Figure 7A:
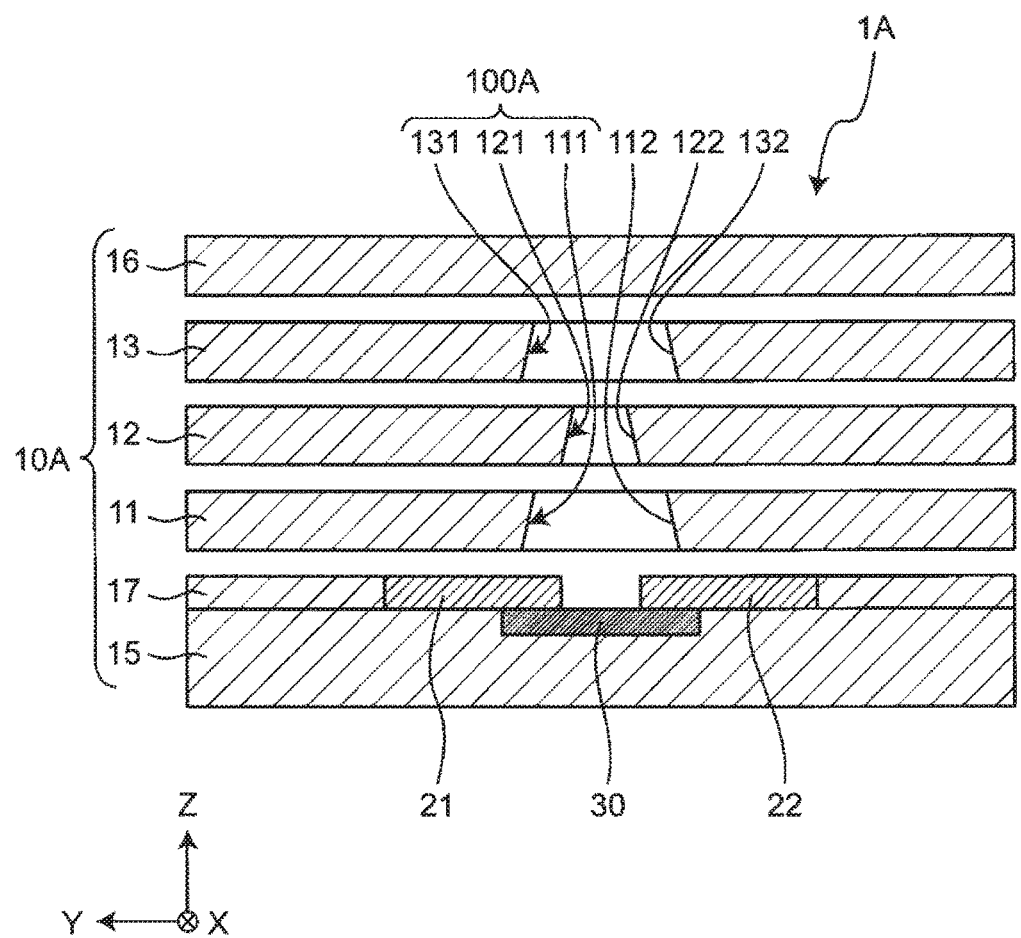
FIG. 7A is a cross-sectional view that illustrates an exploded state of an ESD protective device according to a third preferred embodiment of the present invention.

FIG. 7A is a cross-sectional view that illustrates an exploded state of an ESD protective device according to a third preferred embodiment of the present invention. The third preferred embodiment differs from the first preferred embodiment only in the shape of the hole portions. Only the different configuration is described below. In the third preferred embodiment, the same reference numerals as in the first preferred embodiment indicate the same configurations as in the first preferred embodiment, and the description thereof is omitted.

As illustrated in FIG. 7A, in a hollow portion 100A in an element assembly 10A in an ESD protective device 1A, the inside diameters of the first inner surface 112 and third inner surface 132 are of equal size or substantially equal size. The inside diameters of the first inner surface 112 and the second inner surface 122 are of different sizes. The inside diameter of the second inner surface 122 is smaller than that of the first inner surface 112. That is, the second hole portion 121 is smaller than each of the first hole portion 111 and third hole portion 131.

Accordingly, because the inside diameter of the second inner surface 122 is different in size from that of each of the first inner surface 112 and third inner surface 132, the first to third ceramic layers 11 to 13 of different kinds are able to be used.

Fourth Preferred Embodiment

Figure 7B:
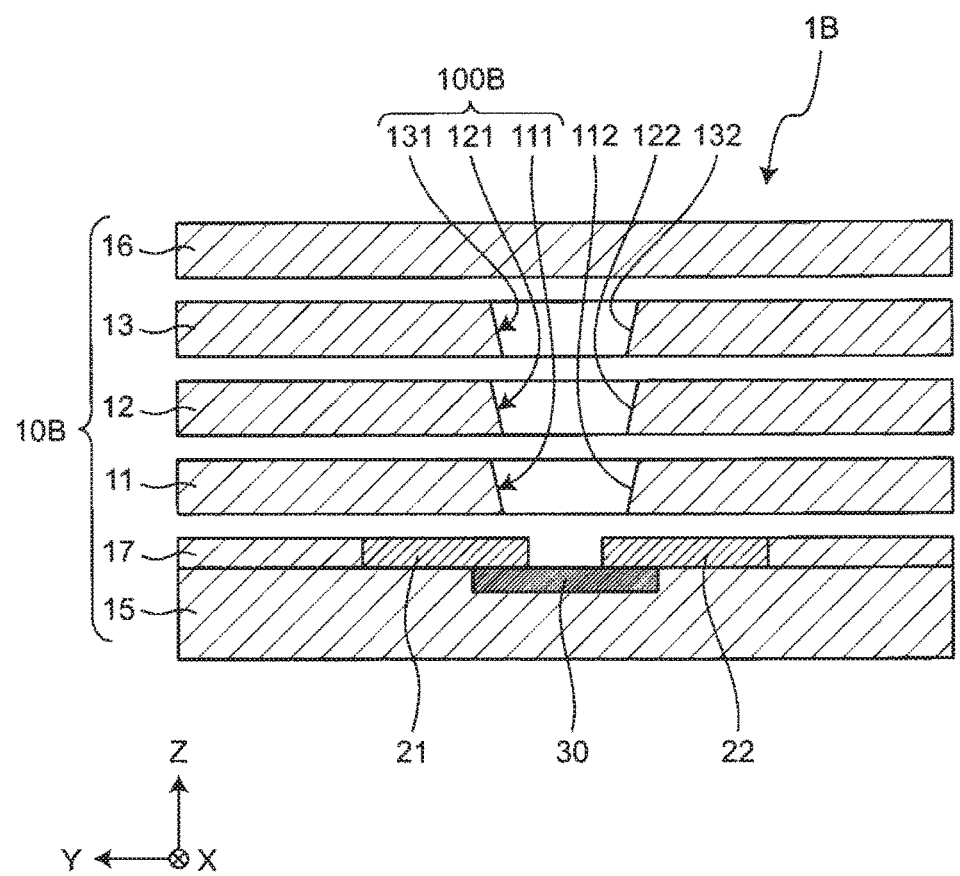
FIG. 7B is a cross-sectional view that illustrates an exploded state of an ESD protective device according to a fourth preferred embodiment of the present invention.

FIG. 7B is a cross-sectional view that illustrates an exploded state of an ESD protective device according to a fourth preferred embodiment of the present invention. The fourth preferred embodiment differs from the first preferred embodiment only in the shape of the hole portions. Only the different configuration is described below. In the fourth preferred embodiment, the same reference numerals as in the first preferred embodiment indicate the same configurations as in the first preferred embodiment, and the description thereof is omitted.

As illustrated in FIG. 7B, in a hollow portion 100B in an element assembly 10B in an ESD protective device 1B, the first to third inner surfaces 112, 122, and 132 are inclined to an opposite direction so as to face the direction opposite to the direction of the first to third inner surfaces in the first preferred embodiment with respect to the Z direction. That is, the inside diameter of each of the first inner surface 112, second inner surface 122, and third inner surface 132 becomes larger toward the Z direction.

Accordingly, the first to third ceramic layers 11 to 13 are able to be laminated such that their orientation is opposite to that of the first to third ceramic layers in the first preferred embodiment.

Fifth Preferred Embodiment

Figure 7C:
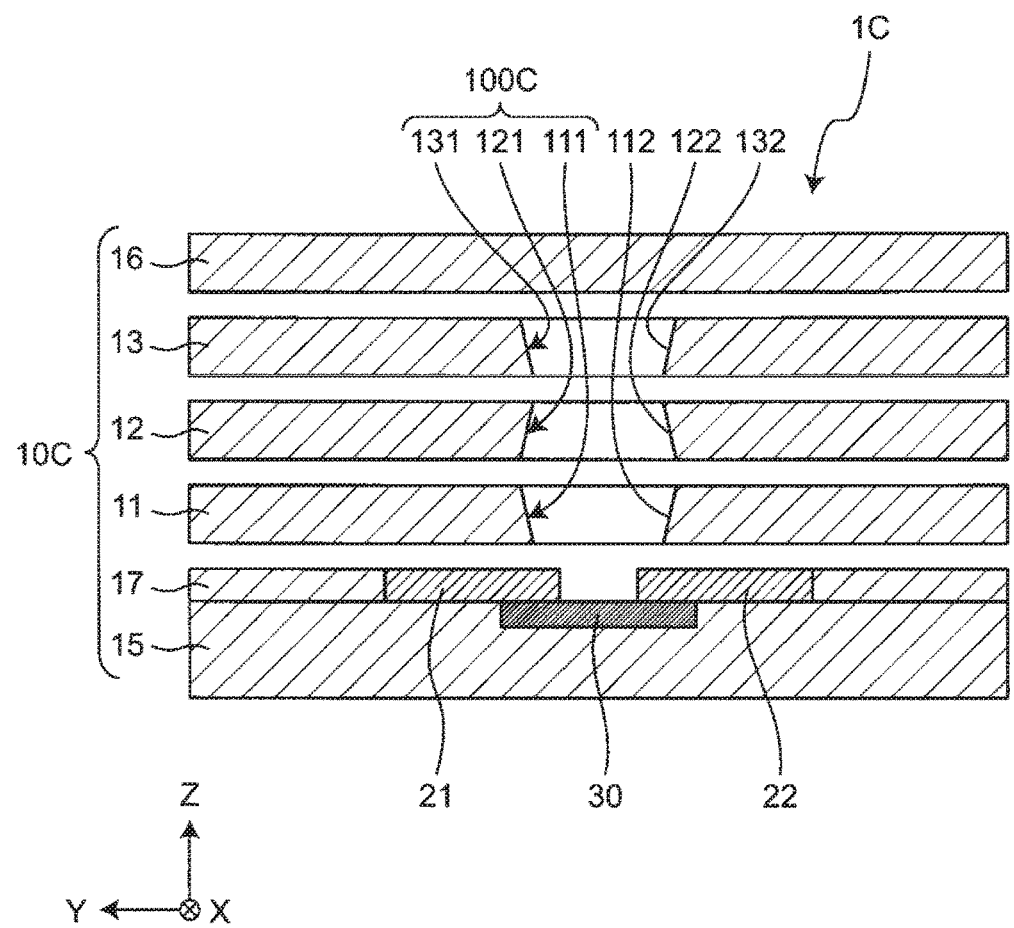
FIG. 7C is a cross-sectional view that illustrates an exploded state of an ESD protective device according to a fifth preferred embodiment of the present invention.

FIG. 7C is a cross-sectional view that illustrates an exploded state of an ESD protective device according to a fifth preferred embodiment of the present invention. The fifth preferred embodiment differs from the first preferred embodiment only in the shape of the hole portions. Only the different configuration is described below. In the fifth preferred embodiment, the same reference numerals as in the first preferred embodiment indicate the same configurations as in the first preferred embodiment, and the description thereof is omitted.

As illustrated in FIG. 7C, in a hollow portion 100C in an element assembly 10C in an ESD protective device 1C, the first and third inner surfaces 112 and 132 are inclined to the same direction so as to face the same direction with respect to the Z direction. The first inner surface 112 and second inner surface 122 are inclined to the opposite directions so as to face the opposite directions with respect to the Z direction. That is, the inside diameter of each of the first and third inner surfaces 112 and 132 becomes larger toward the Z direction. The inside diameter of the second inner surface 122 becomes smaller toward the Z direction.

Accordingly, because the second inner surface 122 is inclined to the opposite direction so as to face the direction opposite to the first inner surface 112 and third inner surface 132 with respect to the Z direction, the first to third ceramic layers 11 to 13 are able to be laminated such that the orientation of the first and third ceramic layers 11 and 13 is opposite to that of the second ceramic layer 12.

The present invention is not limited to the above-described preferred embodiments, and any changes can be made in design without departing from the scope of the present invention. For example, the characteristics in the first to fifth preferred embodiments may be variously combined.

In the above-described preferred embodiments, three inner surfaces, the first to third inner surfaces, are the inclined inner surfaces in the hollow portion. Two or more than three inner surfaces may be inclined.

In the above-described preferred embodiments, the first to third inner surfaces in the hollow portion are flat surfaces (linear tapers). They may be concave curved surfaces or convex curved surfaces (parabolic tapers).

In the above-described preferred embodiments, the first to third hole portions in the ceramic sheets are preferably formed by laser light but they may be formed by machining, for example.

In the above-described preferred embodiments, the shape of the hollow portion as seen from the Z direction preferably is oblong, but it may be oval or rectangular, for example.

In the above-described preferred embodiments, the ESD protective device is manufactured preferably by laminating ceramic sheets, but the ceramic sheets may be formed by printing, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An ESD protective device comprising:
   an element assembly in which a plurality of ceramic layers are laminated in a lamination direction;
   a first discharge electrode and a second discharge electrode disposed inside the element assembly and opposed to each other with a gap disposed therebetween; and
   an auxiliary discharge electrode overlapping the gap as seen from the lamination direction; wherein the element assembly includes a hollow portion on a side opposite to the auxiliary discharge electrode with respect to the first discharge electrode and the second discharge electrode and continuous with the gap; and the hollow portion includes inner surfaces including a first inner surface and a second inner surface, and the first inner surface and the second inner surface are aligned in the lamination direction and inclined to the lamination direction in a cross section including the lamination direction.

2. The ESD protective device according to claim 1, wherein the first inner surface and the second inner surface are inclined to a same direction so as to face the same direction with respect to the lamination direction.

3. The ESD protective device according to claim 1, wherein the first inner surface and the second inner surface are inclined to opposite directions so as to face the opposite directions with respect to the lamination direction.

4. The ESD protective device according to claim 1, wherein an inside diameter of the first inner surface and an inside diameter of the second inner surface are of equal size or substantially equal size.

5. The ESD protective device according to claim 1, wherein an inside diameter of the first inner surface and an inside diameter of the second inner surface are of different sizes.

6. An ESD protective device comprising:
   an element assembly in which a plurality of ceramic layers are laminated in a lamination direction;
   a first discharge electrode and a second discharge electrode disposed inside the element assembly and opposed to each other with a gap disposed therebetween; and
   an auxiliary discharge electrode overlapping the gap as seen from the lamination direction; wherein
   the element assembly includes a hollow portion on a side opposite to the auxiliary discharge electrode with respect to the first discharge electrode and the second discharge electrode and continuous with the gap; and
   the hollow portion includes a stepped side surface.

7. The ESD protective device according to claim 6, wherein the hollow portion includes inner surfaces including a first inner surface and a second inner surface, and the first inner surface and the second inner surface are aligned in the lamination direction and inclined to the lamination direction in a cross section including the lamination direction.

8. The ESD protective device according to claim 7, wherein the first inner surface and the second inner surface are inclined to a same direction so as to face the same direction with respect to the lamination direction.

9. The ESD protective device according to claim 7, wherein the first inner surface and the second inner surface are inclined to opposite directions so as to face the opposite directions with respect to the lamination direction.

10. The ESD protective device according to claim 7, wherein an inside diameter of the first inner surface and an inside diameter of the second inner surface are of equal size or substantially equal size.

11. The ESD protective device according to claim 7, wherein an inside diameter of the first inner surface and an inside diameter of the second inner surface are of different sizes.

12. A method for manufacturing an ESD protective device, the method comprising:

preparing a first ceramic sheet by forming a first hole portion on a first ceramic sheet, the first hole portion including a first inner surface inclined to a direction perpendicular or substantially perpendicular to a plane direction of the first ceramic sheet;

preparing a second ceramic sheet by forming a second hole portion on the second ceramic sheet, the second hole portion including a second inner surface inclined to a direction perpendicular or substantially perpendicular to a plane direction of the second ceramic sheet;

disposing an auxiliary discharge electrode on a base ceramic sheet and disposing a first discharge electrode and a second discharge electrode on the auxiliary discharge electrode such that the first discharge electrode and the second discharge electrode are opposed to each other with a gap disposed therebetween;

laminating the first ceramic sheet, the second ceramic sheet, and a cover ceramic sheet in sequence above the first discharge electrode and the second discharge electrode such that the first hole portion and the second hole portion overlap the gap and forming a multilayer body; and firing the multilayer body and forming a hollow portion continuous with the gap from the first hole portion and the second hole portion.

13. The method according to claim 12, wherein the first hole portion and the second hole portion are formed by laser light.

14. The method according to claim 12, wherein in the step of preparing the first ceramic sheet, the first hole portion is filled with paste having a property of being burned out so as to be eliminated during firing; and
   in the preparing the second ceramic sheet, the second hole portion is filled with paste having a property of being burned out so as to be eliminated during firing.

15. The method according to claim 12, wherein
   the hollow portion is on a side opposite to the auxiliary discharge electrode with respect to the first discharge electrode and the second discharge electrode; and
   the hollow portion includes inner surfaces including a first inner surface and a second inner surface, and the first inner surface and the second inner surface are aligned in the lamination direction and inclined to the lamination direction in a cross section including the lamination direction.

16. The method according to claim 15, wherein the first inner surface and the second inner surface are inclined to a same direction so as to face the same direction with respect to the lamination direction.

17. The method according to claim 15, wherein the first inner surface and the second inner surface are inclined to opposite directions so as to face the opposite directions with respect to the lamination direction.

18. The method according to claim 15, wherein an inside diameter of the first inner surface and an inside diameter of the second inner surface are of equal size or substantially equal size.

19. The method according to claim 15, wherein an inside diameter of the first inner surface and an inside diameter of the second inner surface are of different sizes.

20. The method according to claim 12, wherein the hollow portion includes a stepped side surface.

* * * * *